United States Patent
Sharma et al.

(10) Patent No.: US 9,417,657 B2
(45) Date of Patent: Aug. 16, 2016

(54) TIMING CONTROL WITH BODY-BIAS

(71) Applicant: NXP B.V., Eindhoven (NL)

(72) Inventors: Vibhu Sharma, Eindhoven (NL); Ajay Kapoor, Eindhoven (NL); Ralf Malzahn, Seevetal (DE)

(73) Assignee: NXP B.V., Eindhoven (NL)

( * ) Notice: Subject to any disclaimer, the term of this patent is extended or adjusted under 35 U.S.C. 154(b) by 31 days.

(21) Appl. No.: 14/504,789

(22) Filed: Oct. 2, 2014

(65) Prior Publication Data

US 2016/0098062 A1 Apr. 7, 2016

(51) Int. Cl.
*H03K 3/00* (2006.01)
*G06F 1/10* (2006.01)
*H03K 5/159* (2006.01)
*H03K 19/094* (2006.01)

(52) U.S. Cl.
CPC *G06F 1/10* (2013.01); *H03K 5/159* (2013.01); *H03K 19/094* (2013.01)

(58) Field of Classification Search
CPC ............................................. G06F 1/10
See application file for complete search history.

(56) References Cited

U.S. PATENT DOCUMENTS

| | | | |
|---|---|---|---|
| 7,015,741 B2 | 3/2006 | Tschanz et al. | |
| 7,336,752 B2 * | 2/2008 | Vlasenko | H03L 7/0814 327/147 |
| 7,859,062 B1 | 12/2010 | Koniaris et al. | |
| 8,112,734 B2 | 2/2012 | Mbouombouo et al. | |
| 2004/0221211 A1 | 11/2004 | Chen | |
| 2005/0134361 A1 | 6/2005 | Tschanz et al. | |

FOREIGN PATENT DOCUMENTS

EP 2557479 A2 12/2013

OTHER PUBLICATIONS

Partial European Search Report for Patent Appln. No. 15186307.3 (Mar. 1, 2016).
Extended European Search Report for Patent Appln. No. 15186307.3 (Jun. 30, 2016).

* cited by examiner

*Primary Examiner* — Daniel Puentes

(57) ABSTRACT

Aspects of the present disclosure are directed to operating time-based circuitry. As may be implemented in connection with one or more embodiments, an apparatus and or method involved detecting timing characteristics of circuitry operating in respective clock domains, each having a semiconductor body region via which a clock signal path traverses. The respective semiconductor body regions are biased at respective bias levels that are based on the detected timing characteristics of the clock signal path that traverses the semiconductor body region being biased.

20 Claims, 4 Drawing Sheets

TIMING CONTROL WITH BODY-BIAS

Aspects of various embodiments are directed to timing-based circuits and their implementation, with specific aspects directed to controlling timing with body bias.

Many circuits rely upon timing characteristics for properly processing signals. Various such circuits employ one or more clock circuits and respective timing paths, the synchronization of which can be important to proper operation of the circuitry. For instance, many system-on-chip designs use a design corner based approach for timing closure in which processing is carried out in a manner that accounts for possible timing issues such as timing delays.

In some timing applications, products are designed at worst-case corners, as may relate to slow processes, high temperature and changes in supply voltage (e.g., VDD-10%), for signoff and do not allow timing errors. Accounting for targeted timing path slack (e.g., shift in timing to accommodate for error) may involve considerable power and performance overheads. Further, such approaches may be required to accommodate worst-case conditions and may be unnecessary under many operating conditions. As such, various timing applications involve undesirably high power and expense relative to manufacturing cost.

These and other matters have presented challenges to circuitry timing aspects, for a variety of applications.

Various example embodiments are directed to timing circuits and their implementation, as may be implemented to address one or more challenges as noted above.

According to an example embodiment, an apparatus includes a plurality of circuits that operate in respective clock domains, with each circuit including a semiconductor body region via which one or more clock signal paths traverse. A clock circuit generates and provides respective clock signals for each clock domain. The apparatus also includes timing sensors, with one or more of the circuits in each clock domain each having a timing sensor that detects timing characteristics of the at least one clock signal path. A plurality of local bias circuits bias respective semiconductor body regions in at least one of the circuits in each clock domain. In this way, certain amount of controlled differential bias may, for example, be regulated between the semiconductor body regions. Each local bias circuit is coupled to one of the semiconductor body regions and biases the semiconductor body region at a bias level that is based on the detected timing characteristics of the at least one clock signal path that traverses the semiconductor body region. Another embodiment is directed to a method as follows. For a plurality of circuits operating in respective clock domains in which each circuit including a semiconductor body region via which at least one clock signal path traverses, respective clock signals are generated and provided for each clock domain. Timing characteristics are detected for the clock signal path in at least one of the circuits in each clock domain, using a timing sensor for each clock signal path. Each of the semiconductor body regions is biased at a bias level that is based on the detected timing characteristics of the at least one clock signal path that traverses the semiconductor body region, using a local bias circuit coupled to the body region (e.g., as above).

Another embodiment is directed to an apparatus having a sensor circuit and a bias circuit. The sensor circuit detects timing characteristics of circuitry operating in respective clock domains, with each circuit including a semiconductor body region via which at least one clock signal path traverses. The bias circuit biases the respective semiconductor body regions at respective bias levels that are based on the detected timing characteristics of the clock signal path that traverses the semiconductor body region being biased. In this context, each body region can be separately biased at a unique bias level (if so desired), to control timing characteristics of the circuitry. In some embodiments, the bias circuit thus biases each semiconductor body region independently from bias applied to each of the other semiconductor body regions.

The above discussion/summary is not intended to describe each embodiment or every implementation of the present disclosure. For example, one may control the differential bias between different body regions instead of an absolute bias to an individual body region and so forth. The figures and detailed description that follow also exemplify various embodiments.

Various example embodiments may be more completely understood in consideration of the following detailed description in connection with the accompanying drawings, in which.

Figure 1:
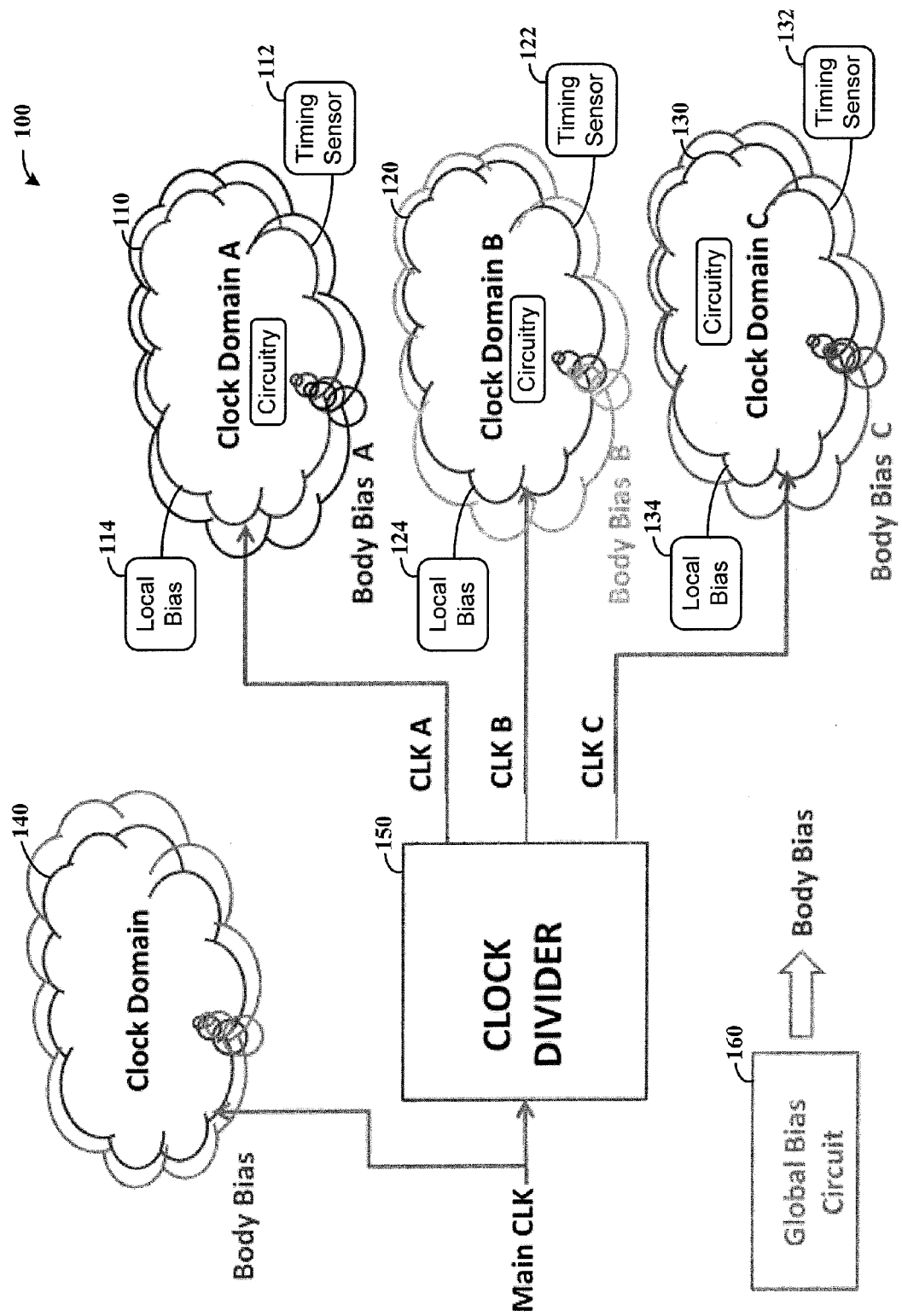
FIG. 1 shows a clock tree distribution network, in accordance with another example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving timing control. While not necessarily so limited, various aspects may be appreciated through a discussion of examples using this context.

Various example embodiments are directed to timing circuits and related methods in which respective biases are applied to different body regions within respective timing paths in an electronic device, to effect control of timing aspects such as timing closure and delay (e.g., relative to timing slack). The biases can be individually or differentially applied to different timing paths or a subset of all timing paths, and used to facilitate control of timing within each path (or a collection of paths). Sensors can be used in one or more portions of the circuit to detect timing characteristics, which can be used to apply a bias the addresses timing errors. For instance, multiple timing sensors can be used to track the impact of various operating conditions that affect timing, and the biases can be respectively applied to address timing issues in this regard. These approaches can be used to meet timing needs of various circuits while doing so in a manner that facilitates desirably fast operation and power conservation, which can address problems including those discussed in the background above.

In various implementations, the timing control is dynamically controlled based upon characteristics of the circuit that affect timing aspects. This timing control can be carried out on individual timing paths, by biasing each path according to the control desired for that path. Timing control can be tailored in this regard to specific timing needs of the circuitry.

The body bias values are controlled in a variety of manners. In some implementations, the applied bias is adjusted according to one or more requirements of operating conditions. Such requirements may relate to one or more of temperature, shifts in threshold gate voltage, fluctuations in supply voltage, and ageing effects as may relate to items such as negative bias-temperature instability (NBTI) and electro-migration.

In various embodiments, a set of fixed body bias values are provided for different clock domains and obtained from local body bias generators for a circuit. The circuit includes respective clocks each having a corresponding value of applied bias set for achieving a set timing slack (e.g., zero timing slack) for timing paths of the clock domain for the clock deemed as being important or critical paths. In some implementations, a global body bias is applied throughout the circuit, with individual body biases applied in addition to the global body bias to fine tune the bias applied to specific body regions in the circuit. Each local body bias generator may, for example, include a programmable generator that sets an applied bias based on programming inputs.

In some implementations, static timing analysis is used to identify failing or troublesome timing paths, and timing paths that may be deemed important or critical. For these timing paths, simulations with body bias applied on clock paths is performed to determine an optimum bias value. This optimum bias value can be used as a base for each respective path, with the bias being modified to address changing conditions in order to maintain desired timing characteristics.

In one particular embodiment, reverse body biasing is applied for achieving zero worst case negative slack of a signal communicated via a launching clock and received at a capturing clock, with slack being defined as:

$$\text{Slack} = T_{delay,C.C} - [T_{delay,L.C} + T_{delay,PATH} + T_{setUp}],$$

in which
$T_{delay,C.C}$—Propagation delay for the capturing clock.
$T_{delay,L.C}$—Propagation delay for the launching clock.
$T_{delay,PATH}$—Combinational path delay
$T_{setUp}$—Setup time requirement of capturing flip flop used to capture the signal.
Slack—Timing slack for timing closure its minimum target value is zero.

For general information regarding timing circuits, and for specific information regarding timing applications and approaches to biasing with which one or more embodiments herein may be implemented, reference may be made to U.S. Pat. No. 8,112,734 B2 (Mbouombouo, et al.); and to U.S. Pat. No. 7,015,741 B2 (Tschanz, et al.), both of which are fully incorporated herein by reference.

In accordance with another embodiment, an apparatus includes respective circuits that operate in different clock domains. Each circuit includes a semiconductor body region via which one or more clock signal path traverses according to a clock circuit that provides respective clock signals for each clock domain. Respective timing sensors detect timing characteristics of the clock signal paths, via one of the circuits in each clock domain (e.g., with one or more timing sensors per domain). Local bias circuits are coupled to one of the semiconductor body regions (e.g., well regions that are separate from well regions of data paths) in one of the circuits for each clock domain, each local bias circuit being operable to bias the semiconductor body region in response to the detected timing characteristics of the at least one clock signal path that traverses the semiconductor body region.

The bias is applied in a variety of manners, and the level can thus be adjusted based on the timing characteristics of each semiconductor body region, tailoring the clock path control to each clock domain. The bias level may, for example, be based on one or more of programmed operating parameters of the bias circuit, temperature, shifts in threshold voltage levels of at least one of the circuits, fluctuation in supply voltage, electro-migration and ageing effects involving negative bias-temperature instability.

In some embodiments, each timing sensor detects timing delays in a designated clock signal path. Each local bias circuit dynamically adjusts an amount of the applied bias based on variations in the detected timing delay. This can be carried out independently from bias applied by the other local bias circuits. The bias may, for example, involve a reverse body bias, which can be implemented to increase propagation delay of the semiconductor body region.

In some embodiments, one or more of the local bias circuits generates a predetermined bias that provides zero timing slack for a selected timing path within the timing domain that the local bias circuit resides. This predetermined bias may, for example, correlate to an optimum bias for operation of the circuitry. The local bias circuits modify their respectively applied bias levels relative to the predetermined bias level, based on the detected timing characteristics for the clock domain (e.g., of the circuit being biased or other circuitry within). In this context, the zero timing slack may be implemented as discussed above, which may correspond to a predetermined time during which a signal travels on the selected timing path.

In certain embodiments, an apparatus as above includes a global bias circuit that biases multiple (or all) of the semiconductor body regions at a predefined level. Each local bias circuit operates with the global bias circuit to cooperatively bias the semiconductor body region to which the local bias circuit is coupled.

The timing sensors are implemented in a variety of manners, to suit particular applications. The timing sensors may, for example track an impact of dynamic variations in timing corresponding to timing errors, and counteract the timing errors by adjusting the bias. In certain embodiments, one or more timing sensors detect errors by detecting and comparing a data state at a particular circuit node to a known data state at which the node is to provide.

In some embodiments, at least two timing sensors are provided for one of the clock domains, with both sensors being used to sense characteristics of the clock domain that are used to control the applied bias. In some implementations, two similar sensors are used at different portions of a clock path. In other implementations, two different types of sensors (e.g., temperature and timing) are used to provide different characteristics upon which bias adjustments can be based. In further implementations, sensors are used in different portions of the apparatus to provide timing indications for a specific timing path, in which one or more sensors may be employed outside of the timing path.

In a more particular embodiment, one or more of the timing sensors includes a replica timing path. The replica timing path replicates one of the circuits representing a clock signal path in one of the clock domains. The one or more timing sensors detect timing characteristics of the at least one clock signal path based on timing characteristics of the replica timing path. Using this approach, a replica path can be used for detecting timing issues while a bias is applied to the path being replicated.

Various embodiments are directed to methods as may be implemented in accordance with one or more aspects discussed herein, such the various apparatus-based embodiments described herein and/or shown in the figures. In one such embodiment, respective clock signals are generated and provided for each respective clock domain in which one or more of a plurality of circuits operate. Each circuit includes a semiconductor body region via which at least one clock signal path traverses, timing characteristics of which are detected using a timing sensor for each clock signal path. A local bias circuit is used to bias each semiconductor body region at a level that is based on the detected timing characteristics of the at least one clock signal path that traverses the semiconductor body region. The timing characteristics may, for example, involve a timing delay in the clock signal path being monitored (or predetermined according to application use-case), in which an amount of bias applied to the body corresponding region is dynamically or statically adjusted during operation. Other timing characteristics may pertain to one or more of temperature-related fluctuations in operation of the circuit, a shift in threshold voltage levels of the circuit, fluctuation in supply voltage to the circuit, electro-migration in the circuit, and ageing effects of the circuit involving negative bias-temperature instability. Bias adjustments may be based on variations in the detected timing delay, and independent or dependent from bias applied to other semiconductor body regions.

A variety of biasing methods are implemented to suit particular embodiments. In some embodiments, the semiconductor body regions independently from one another, using a different local bias circuit. Each semiconductor body region can thus be biased based on detected timing characteristics exclusive to a clock signal path that traverses the semiconductor body region being biased. In certain embodiments, signals are passed on circuitry with a body bias applied thereto, and an optimum bias value that provides a selected timing characteristic for the at least one of the circuits can be discovered. This optimum bias value can be applied to the semiconductor body region in the at least one of the circuits, and adjusted to accommodate further variations in operational characteristics. In other embodiments, all of the semiconductor body regions in a device are globally biased at a predefined level, with each semiconductor body region being cooperatively biased with both the global bias and the local bias applied thereto.

Turning now to the figures, FIG. 1 shows an apparatus 100, in accordance with another example embodiment. The apparatus 100 includes several clock domains, with respective domains 110 (A), 120 (B) and 130 (C) shown by way of example, and a global clock domain 140 applicable to some or all of the clock domains. A clock circuit 150 (e.g., a clock divider as noted) provides respective clock signals to each clock domain as shown, and a global bias circuit 160 optionally is included to apply a global body bias to the apparatus, as shown via clock domain 140.

Each clock domain has a timing sensor (112/222/232) and local bias circuit (214/224/234) that respectively sense timing characteristics for the domain and apply a local body bias based on the sensed timing characteristics, such as characterized in one or more embodiments herein. In some implementations, the local bias circuits are implemented with the clock circuit 150.

Accordingly, the bias applied to each of the clock domains 110, 120 and 130 can be tailored independently relative to the bias applied to the other clock domains. Such approaches may address timing issues as may relate to threshold voltage mismatches, changes in voltage supply (e.g., due to IR drop on supply lines of a combinational path), ageing effects and others, as may result the data output of a combinational output arriving after the rising edge of the clock. This approach can thus mitigate shifting of zero or positive worst case timing slack to a negative value, by increasing the propagation delay of a capturing clock with the application of reverse body bias voltage that is adjusted depending on the severity of timing fluctuations.

Figure 2:
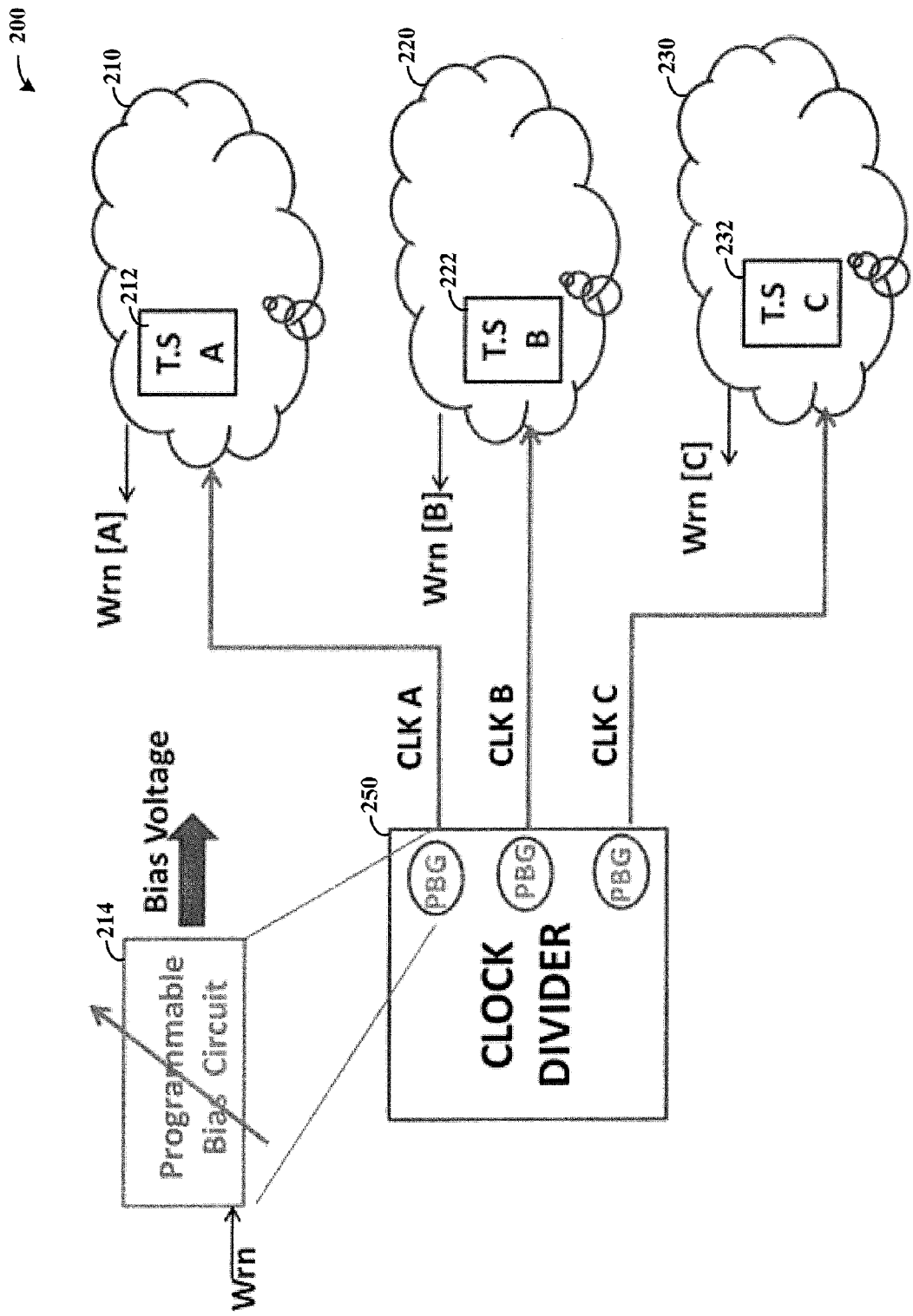
FIG. 2 shows an apparatus and approach involving the dynamic adjustment of bias voltages for different clock domains, in accordance with another example embodiment.

FIG. 2 shows an apparatus 200 and approach involving the dynamic adjustment of bias voltages for different clock domains, in accordance with another example embodiment. The apparatus 200 may be implemented in a manner similar to that shown in FIG. 1, for clock domains 210, 220 and 230, each of which is controlled via a programmable bias generator (PBG) implemented in a clock divider circuit 250. Each domain has a timing sensor 212, 222 and 232 as shown. By way of example, programmable bias circuit 214 is shown in an inset, for providing a local bias voltage to clock domain 210. Each timing sensor generates a warning signal "Wrn" in response to detecting timing characteristics that adversely affect the operation of the respective clock domains, such as described herein (e.g., by detecting erroneous data, exceeding of a threshold temperature or other characteristics). The programmable bias circuitry responds to the respective warning signals by generating a local bias to address timing characteristics, such as discussed herein.

Figure 3:
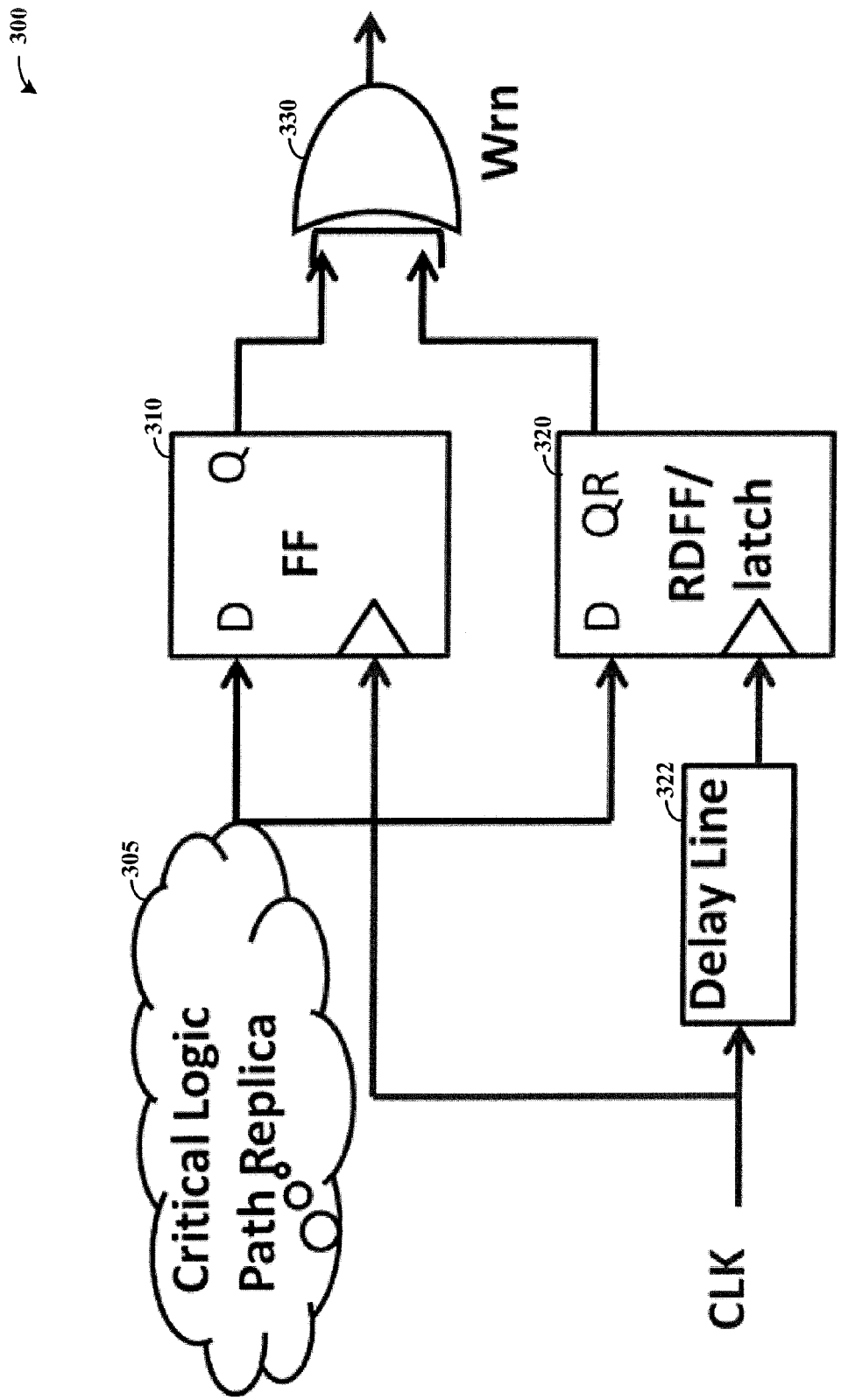
FIG. 3 shows a timing circuit, in accordance with another example embodiment.

FIG. 3 shows a timing circuit 300, in accordance with another example embodiment. The circuit 300 includes a replica combinational path 305 (resembling a data path of a particular clock domain in design), with a flip flop 310, a latch 320 (sampling input data on clock signal delayed at 322) and a XOR gate 330. If flip flop 310 samples correct data, the output of the XOR gate compares this with output of RDFF/latch 320 and the output is low. If data from replica combinational logic circuit 305 arrives late, the flip flop 310 samples incorrect data, which is compared by the XOR gate 330 with the output of RDFF/latch (which is designed by taking margins, to ensure correct data sampling), and the warning signal is flagged to indicate that the comparison failed.

Figure 4:
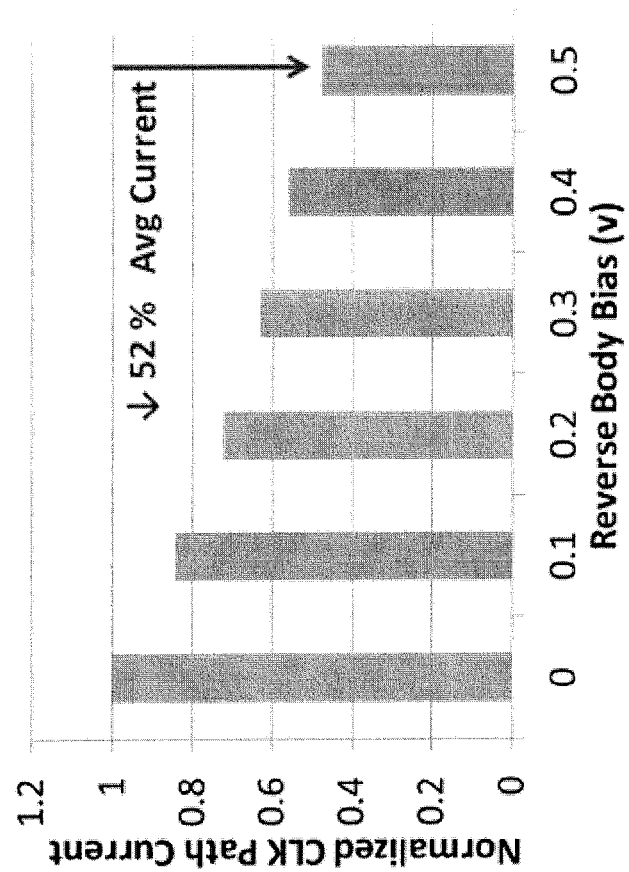
FIG. 4 shows respective plots representing applications of reverse body bias on clock path delay and power consumption, in accordance with one or more embodiments.
Figure 4:
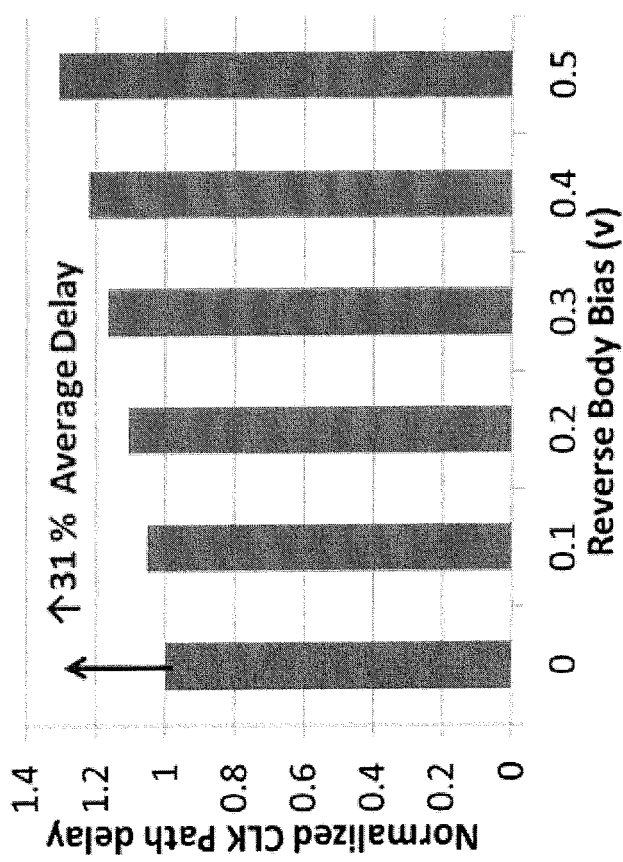

FIG. 4 shows respective bar graphs 401 and 402 representing applications of reverse body bias on clock path delay and power consumption, in accordance with one or more embodiments. Timing sensors can be placed in divided clock domains on pre-selected timing paths (e.g., critical paths). When a warning signal is detected (e.g., as shown in FIG. 3), the bias voltage of the corresponding clock domain is adjusted via a local/programmable bias generator. In this context, graph 401 shows normalized clock path delay for applied reverse body biases, and graph 402 shows power consumption (as related to normalized clock path current) of a capturing clock signal for the respective reverse body biases. Accordingly, as an illustrative embodiment, application of a 0.5V reverse body bias voltage results in 31% increase in delay. For a capturing clock with a propagation delay of 1 ns, application of 0.5V reverse body bias can address timing slack of 31 Ops and achieve a 52% reduction in average power consumption. Such an approach may be relevant, for example, to a clock tree path of a capturing clock, with a supply voltage (VDD) of 1.1V, a temperature of 27° C., as may be implemented with a nominal process corner as discussed above.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., bias circuit or timing sensor). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein.

For example, different timing characteristics can be used to set an appropriate bias, and different levels of bias can be applied for achieving certain results. Such modifications do not depart from the true spirit and scope of various aspects of the invention, including aspects set forth in the claims.

What is claimed is:

1. An apparatus comprising:
   a plurality of circuits operating in respective clock domains, each circuit including a semiconductor body region via which at least one a clock signal path traverses;
   a clock circuit configured and arranged to generate and provide respective clock signals for each clock domain;
   a plurality of timing sensors including, for at least one of the circuits in each clock domain, a timing sensor configured and arranged to detect timing characteristics of the at least one two clock signal path; and
   a plurality of local bias circuits including, for the semiconductor body region in at least one of the circuits in each clock domain, a bias circuit coupled to the semiconductor body region and configured and arranged to bias the semiconductor body region at a bias level that is based on the detected timing characteristics of the at least one clock signal path that traverses the semiconductor body region.

2. The apparatus of claim 1, wherein
   each timing sensor is configured and arranged to detect the timing characteristics by detecting timing delay in a designated clock signal path, and
   each local bias circuit is configured and arranged to dynamically adjust an amount of the bias during operation of the plurality of circuits, based on variations in the detected timing delay and independently from bias applied by the other local bias circuits.

3. The apparatus of claim 1, further including a global bias circuit configured and arranged to bias all of the semiconductor body regions at a predefined level, wherein each local bias circuit is configured and arranged with the global bias circuit to cooperatively bias the semiconductor body region to which the local bias circuit is coupled.

4. The apparatus of claim 1, wherein each of the local bias circuits is configured and arranged to provide a predetermined bias level that provides a zero timing slack for a selected timing path within the timing domain that the local bias circuit resides, and to modify the bias
   level relative to the predetermined bias level based on the detected timing characteristics, the zero timing slack corresponding to a predetermined time during which a signal travels on the selected timing path.

5. The apparatus of claim 1, wherein at least one of the local bias circuits is configured and arranged to bias the semiconductor body region at a bias level that is based on at least one of: programmed operating parameters of the bias circuit, temperature of the apparatus, shifts in threshold voltage levels of at least one of the circuits, fluctuation in supply voltage, electro-migration and ageing effects involving negative bias-temperature instability.

6. The apparatus of claim 1, wherein the plurality of timing sensors includes at least two sensors for at least one of the clock domains, and wherein one of the local bias circuits in the at least one of the clock domains is configured and arranged to provide the bias based on timing characteristics sensed by the at least two sensors.

7. The apparatus of claim 1, wherein the plurality of timing sensors are configured and arranged to track an impact of dynamic variations in timing corresponding to timing errors, and are configured and arranged to counteract the timing errors by adjusting the bias.

8. The apparatus of claim 1, wherein the semiconductor body regions for the clock signal paths include well regions that are separate from well regions of data paths in the apparatus.

9. The apparatus of claim 1, wherein at least one of the bias circuits is configured and arranged to increase propagation delay of the semiconductor body region in the at least one of the circuits by applying a reverse body bias to the bias region.

10. The apparatus of claim 1, wherein at least one of the timing sensors is configured and arranged to detect timing characteristics by detecting a data state at a node on the at least one clock signal path, and to detect a timing error by comparing the detected data state to a known data state at which the clock signal path is designed to provide.

11. The apparatus of claim 1, wherein at least one of the timing sensors is configured and arranged to detect timing characteristics by detecting characteristics of a circuit in the apparatus that is separate from the particular clock signal path to which a bias is applied, and one of the local bias circuits coupled to the particular clock signal path applies a bias to the clock signal path based upon the characteristics of the separate circuit.

12. The apparatus of claim 1, wherein at least one of the timing sensors includes a replica timing path that replicates one of the circuits representing the at least one clock signal path in one of the clock domains, and is configured and arranged to detect timing characteristics of the at least one clock signal path based on timing characteristics of the replica timing path.

13. A method comprising:
   for a plurality of circuits operating in respective clock domains, each circuit including a semiconductor body region via which at least one clock signal path traverses, generating and providing respective clock signals for each clock domain;
   detecting timing characteristics of the at least one clock signal path in at least one of the circuits in each clock domain, using a timing sensor for each clock signal path; and
   for each of the semiconductor body regions, biasing the semiconductor body region with a local bias circuit at a bias level that is based on the detected timing characteristics of the at least one clock signal path that traverses the semiconductor body region.

14. The method of claim 13, wherein biasing the semiconductor body region includes biasing one of the semiconductor body regions independently from a bias applied to another one of the semiconductor body regions using a different local bias circuit, each semiconductor body region being biased based on detected timing characteristics exclusive to the clock signal path that traverses the semiconductor body region being biased.

15. The method of claim 13,
further comprising passing signals on the at least one of the circuits with a body bias applied to the semiconductor body region therein, and determining therefrom an optimum bias value that provides a selected timing characteristic for the at least one of the circuits, and
wherein detecting the timing characteristics for the at least one of the circuits includes applying the optimum bias value to the semiconductor body region in the at least one of the circuits.

16. The method of claim 13, wherein
detecting timing characteristics includes detecting timing delay in each clock signal path, and
biasing each semiconductor body region includes dynamically adjusting an amount of bias applied to the body region during operation of the plurality of circuits, based on variations in the detected timing delay and independently from bias applied to other semiconductor body regions.

17. The method of claim 13, further including globally biasing all of the semiconductor body regions at a predefined level with a global bias circuit, wherein biasing each semiconductor body region includes cooperatively biasing each semiconductor body region with the global bias and the bias applied via the local bias circuit in each region.

18. The method of claim 13, wherein biasing each semiconductor body region includes biasing the semiconductor body region based on a characteristic of the circuit in the clock signal path including the semiconductor body region, the characteristic including at least one of: temperature, a shift in threshold voltage levels, fluctuation in supply voltage, electro-migration, and ageing effects involving negative bias-temperature instability.

19. An apparatus comprising:
a sensor circuit configured and arranged to detect timing characteristics of circuitry operating in respective clock domains, each circuit including a semiconductor body region via which at least one clock signal path traverses; and
a bias circuit configured and arranged to bias the respective semiconductor body regions at respective bias levels that are based on the detected timing characteristics of the clock signal path that traverses the semiconductor body region being biased.

20. The apparatus of claim 19, wherein the bias circuit is configured and arranged to bias each semiconductor body region independently from bias applied to each of the other semiconductor body regions.

\* \* \* \* \*